United States Patent
Forbes

(10) Patent No.: US 7,221,605 B2
(45) Date of Patent: May 22, 2007

(54) SWITCHED CAPACITOR DRAM SENSE AMPLIFIER WITH IMMUNITY TO MISMATCH AND OFFSETS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 10/931,552

(22) Filed: Aug. 31, 2004

(65) Prior Publication Data

US 2006/0044903 A1   Mar. 2, 2006

(51) Int. Cl.
G11C 7/00   (2006.01)

(52) U.S. Cl. ............... 365/205; 365/202; 365/204; 365/207; 365/189.09; 365/149

(58) Field of Classification Search ............. 365/205, 365/202, 204, 207, 189.09, 149
See application file for complete search history.

(56) References Cited

U.S. PATENT DOCUMENTS

| | | | |
|---|---|---|---|
| 4,985,643 A * | 1/1991 | Proebsting | 326/17 |
| 5,237,533 A * | 8/1993 | Papaliolios | 365/207 |
| 5,339,274 A | 8/1994 | Shong et al. | |
| 5,416,371 A | 5/1995 | Katayama et al. | |
| 5,568,440 A | 10/1996 | Tsukude et al. | |
| 5,708,622 A | 1/1998 | Ohtani et al. | |
| 5,818,750 A | 10/1998 | Manning | |
| 5,828,611 A * | 10/1998 | Kaneko et al. | 365/203 |
| 5,859,806 A | 1/1999 | Wada | |
| 5,940,317 A | 8/1999 | Manning | |
| 5,995,163 A | 11/1999 | Fossum | |
| 6,049,496 A | 4/2000 | Forbes et al. | |
| 6,052,307 A | 4/2000 | Huber et al. | |
| 6,091,654 A | 7/2000 | Forbes et al. | |
| 6,104,066 A | 8/2000 | Noble et al. | |
| 6,115,316 A | 9/2000 | Mori et al. | |
| 6,141,239 A | 10/2000 | Manning | |
| 6,150,851 A * | 11/2000 | Ohmi et al. | 327/91 |
| 6,157,688 A | 12/2000 | Tamura et al. | |
| 6,166,367 A | 12/2000 | Cho | |
| 6,198,677 B1 * | 3/2001 | Hsu et al. | 365/203 |
| 6,235,569 B1 | 5/2001 | Noble et al. | |
| 6,246,622 B1 * | 6/2001 | Sugibayashi | 365/210 |
| 6,262,930 B1 | 7/2001 | Mori et al. | |
| 6,285,613 B1 * | 9/2001 | Koya | 365/205 |
| 6,288,575 B1 | 9/2001 | Forbes | |
| 6,304,505 B1 | 10/2001 | Forbes et al. | |
| 6,319,800 B1 | 11/2001 | Manning | |

(Continued)

OTHER PUBLICATIONS

U.S. Appl. No. 10/931,786, filed Sep. 1, 2004, Sample and Hold Memory Sense Amplifier.

(Continued)

Primary Examiner—Viet Q. Nguyen
(74) Attorney, Agent, or Firm—Schwegman, Lundberg, Woessner & Kluth, P.A.

(57) ABSTRACT

A switched capacitor sense amplifier includes capacitively coupled input, feedback, and reset paths to provide immunity to the mismatches in transistor characteristics and offsets. The sense amplifier includes a cross-coupled pair of inverters with capacitors absorbing offset voltages developed as effects of the mismatches. When used in a dynamic random access memory (DRAM) device, this immunity to the mismatches and offsets allows the sense amplifier to reliably detect and refresh small signals.

29 Claims, 3 Drawing Sheets

U.S. PATENT DOCUMENTS

| | | | |
|---|---|---|---|
| 6,341,088 B2* | 1/2002 | Sakamoto et al. | 365/190 |
| 6,400,629 B1 | 6/2002 | Barth, Jr. et al. | |
| 6,437,608 B1 | 8/2002 | Miyabe et al. | |
| 6,529,237 B1 | 3/2003 | Tsay et al. | |
| 6,538,476 B2 | 3/2003 | Forbes | |
| 6,696,852 B1 | 2/2004 | Brunolli | |
| 6,741,104 B2 | 5/2004 | Forbes et al. | |
| 6,759,657 B2 | 7/2004 | Iida et al. | |
| 6,803,794 B2* | 10/2004 | Martin et al. | 327/52 |
| 6,809,981 B2 | 10/2004 | Baker | |
| 6,813,190 B2 | 11/2004 | Marotta et al. | |
| 6,822,904 B2 | 11/2004 | Gallo et al. | |
| 6,822,919 B2* | 11/2004 | Sahoo | 365/208 |
| 6,842,377 B2* | 1/2005 | Takano et al. | 365/185.21 |
| 6,861,634 B2 | 3/2005 | Rossi | |
| 6,885,396 B1 | 4/2005 | Panicacci et al. | |
| 6,885,580 B2 | 4/2005 | Baker | |
| 6,912,167 B2* | 6/2005 | Tam | 365/207 |
| 6,920,060 B2 | 7/2005 | Chow et al. | |
| 6,937,052 B2* | 8/2005 | Tam | 324/765 |
| 2005/0002218 A1 | 1/2005 | Nazarian | |
| 2005/0018060 A1 | 1/2005 | Takayanagi | |
| 2006/0044012 A1 | 3/2006 | Forbes | |
| 2006/0044907 A1 | 3/2006 | Forbes et al. | |

OTHER PUBLICATIONS

U.S. Appl. No. 10/931,379, filed Aug. 31, 2004, Capacitively—Coupled Level Restore Circuits for Low Voltage Swing Logic Circuits.

Blalock, Travis N., et al., "A High-speed Sensing Scheme for 1T Dynamic RAMs Utilizing the Clamped Bit-line Sense Amplifier", *IEEE Journal of Solid-State Circuits*, 27(4), (Apr. 1992),618-625.

Dhong, Sang H., et al., "High Speed Sensing Scheme for CMIS DRAM's", *IEEE Journal of Solid-State Circuits*, vol. 23, No. 1, (Feb. 1998),34-40.

Kuge, Shigehiro , et al., "SOI-DRAM Circuit Technologies for Low Power High Speed Multigiga Scale Memories", *IEEE Journal of Solid-State Circuits*, 31(4), (Apr. 1996),pp. 586-591.

Lu, Nicky C., et al., "Half-Vdd Bit-Line Sensing Scheme in CMOS DRAM's", *Journal of Solid-State Circuits*, vol. SC-19, No. 4, (Aug. 1984),451-454.

Parke, Stephen A., "Optimization of DRAM Sense Amplifiers for the Gigabit Era", *IEEE, Proceedings of the 40th Midwest Symposium on Circuits and Systems*, Sacramento, CA,(1997),pp. 209-212.

Rabaey, Jan M., *Digital Integrated Circuits: A Design Perspective, Section 10.4.2*, Prentice Hall Electronics and VLSI Series,(1996),596-603.

Suh, Jung-Won , et al., "Offset-Trimming Bit-Line Sensing Scheme for Gigabit-Scale DRAM's", *IEEE Journal of Solid-State Circuits*, 31 (7), (Jul. 1996),pp. 1025-1028.

Suma, Katsuhiro , et al., "An SOI-DRAM with Wide Operating Voltage Range by CMOS/SIMOX Technology", *IEEE Journal of Solid-State Circuits*, 29(11), (Nov. 1994),pp. 1323-1329.

U.S. Appl. No. 11/493,961, filed Jul. 27, 2006, Switched Capacitor Dram Sense Amplifier with Immunity to Mismatch and Offsets.

U.S. Appl. No. 11/493,960, filed Jul. 27, 2006, Switched Capacitor Dram Sense Amplifier with Immunity to Mismatch and Offsets.

U.S. Appl. No. 11/485,218, filed Jul. 12, 2006, Sample and Hold Memory Sense Amplifier.

U.S. Appl. No. 11/493,113, filed Jul. 26, 2006, Capacitively—Coupled Level Restore Circuits for Low Voltage Swing Logic Circuits.

\* cited by examiner

SWITCHED CAPACITOR DRAM SENSE AMPLIFIER WITH IMMUNITY TO MISMATCH AND OFFSETS

TECHNICAL FIELD

This document generally relates to memory sense amplifiers and particularly, but not by way of limitation, to a cross-coupled sense amplifier with a switched capacitor circuit configured to compensate for effects of transistor mismatches and offsets.

BACKGROUND

Sense amplifiers are used in memory devices to allow for reduced voltage swing on the bit lines. In a dynamic random access memory (DRAM) circuit, each data bit is stored in a small storage capacitor that is discharged quickly. A sense amplifier detects a signal representing the bit on a bit line and amplifies the signal to an amplitude near the DRAM circuit's supply voltage. The capacitor is recharged as the signal is amplified. The data bit is refreshed before it ceases to be detectable as the sense amplifier detects and amplifies the signal on a periodic basis, such as every few milliseconds.

Cross-coupled sense amplifiers are among various sense amplifier configurations used in DRAM circuits. A known cross-coupled sense amplifier includes a pair of inverters "cross coupled" between a complementary pair of bit lines. Each inverter has its input connected to one bit line and its output connected to the complementary bit line. A reset switch, when closed, causes both bit lines to be precharged to about one half of the DRAM circuit's supply voltage by connecting the bit lines to each other and to all the inputs and outputs of both inverters. A cross-coupled sense amplifier provides for fast signal amplification for the DRAM circuits. However, in practice it is difficult to provide the pair of inverters with perfectly matched transistors. Mismatches in transistor characteristics may produce, for example, an offset voltage across the outputs of the inverters during the reset. This offset is reflected to the inputs of the inverters. In the worst case, this reflected offset is detected as a signal representing a data bit after the reset, resulting in a data error.

Therefore, there is a need to provide immunity to the mismatches in transistor characteristics and offsets while maintaining the fast response of cross-coupled sense amplifiers.

SUMMARY

A switched capacitor sense amplifier includes capacitively coupled input, feedback, and reset paths to provide immunity to the mismatches in transistor characteristics and offsets. The sense amplifier includes a cross-coupled pair of inverters with capacitors absorbing offset voltages developed as effects of the mismatches. When used in a DRAM device, this immunity to the mismatches and offsets allows the sense amplifier to reliably detect and refresh small signals.

In one embodiment, a memory circuit includes a complementary pair of first and second bit lines. A switched capacitor sense amplifier is coupled between the first and second bit lines. The switched capacitor sense amplifier includes a cross-coupled pair of first and second inverters. The input of the first inverter is AC-coupled to the first bit line through a first input capacitor. The output of the first inverter is coupled to the second bit line. The input of the second inverter is AC-coupled to the second bit line through a second input capacitor. The output of the second inverter is coupled to the first bit line. A first feedback capacitor and a first reset switch are each coupled between the input and output of the first inverter. A second feedback capacitor and a second reset switch each are coupled between the input and the output of the second inverter. When the first and second reset switches are closed to reset the switched capacitor sense amplifier, the input and output of each of the first and second amplifiers are equalized. Voltages developed across the first and second input capacitors compensate for offset voltages developed in the sense amplifier circuit due to the mismatches in transistor characteristics. The offset voltages are therefore substantially prevented from appearing in the bit lines and being detected as signals.

In one embodiment, a method for resetting a sense amplifier in preparation for sensing a memory state of a DRAM cell is provided. The sense amplifier includes a first inverter, a first input capacitor coupling a first bit line and an input of the first inverter, a second inverter, and a second input capacitor coupling a second bit line and an input of the second inverter. The second bit line is coupled to the input of the first inverter to place a potential of the second bit line at the input of the first inverter such that a voltage difference between the first and second bit lines is placed across the first input capacitor. The first bit line is coupled to the input of the second inverter to place a potential of the first bit line at the input of the second inverter such that a voltage difference between the second and first bit lines is placed across the second input capacitor.

This Summary is an overview of some of the teachings of the present application and not intended to be an exclusive or exhaustive treatment of the present subject matter. Further details about the present subject matter are found in the detailed description and appended claims. Other aspects of the invention will be apparent to persons skilled in the art upon reading and understanding the following detailed description and viewing the drawings that form a part thereof, each of which are not to be taken in a limiting sense. The scope of the present invention is defined by the appended claims and their equivalents.

BRIEF DESCRIPTION OF THE DRAWINGS

In the drawings, like numerals describe similar components throughout the several views. The drawings illustrate generally, by way of example, but not by way of limitation, various embodiments discussed in the present document.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description provides examples, and the scope of the present invention is defined by the appended claims and their equivalents.

It should be noted that references to "an", "one", or "various" embodiments in this document are not necessarily to the same embodiment, and such references contemplate more than one embodiment.

In this document, "AC" refers to "alternating current." "DC" refers to "direct current." An "MOS transistor" or "MOSFET" refers to a metal-oxide semiconductor field-effect transistor. An "NMOS transistor" refers to an n-channel metal-oxide semiconductor field-effect transistor (or n-channel MOSFET). A "PMOS" refers to a p-channel metal-oxide semiconductor field-effect transistor (or p-channel MOSFET). Each MOS transistor (either NMOS or PMOS transistor) has a gate terminal, a drain terminal, and a source terminal.

This document discusses, among other things, a switched capacitor sense amplifier that improves the accuracy of a cross-coupled sense amplifier by providing immunity to mismatches in transistor characteristics and offsets. Instead of a DC-coupled reset path connecting all inputs and outputs of the cross-coupled pair of inverters to the complementary pair of bit lines when the reset switch is closed, as in the known cross-coupled sense amplifier, an AC-coupled reset path is coupled between the complementary bit lines. Capacitors in the AC-coupled reset path absorb offset voltages developed in the sense amplifier circuit due to the mismatches in transistor characteristics. Thus, the offset voltages are substantially prevented from appearing in the bit lines and being detected as signals. When compared to the known cross-coupled sense amplifier, the elimination of the effects of the mismatches in transistor characteristics and offsets provides the switched capacitor sense amplifier with a better sensitivity, i.e., the ability to reliably detect smaller signals.

Figure 1:
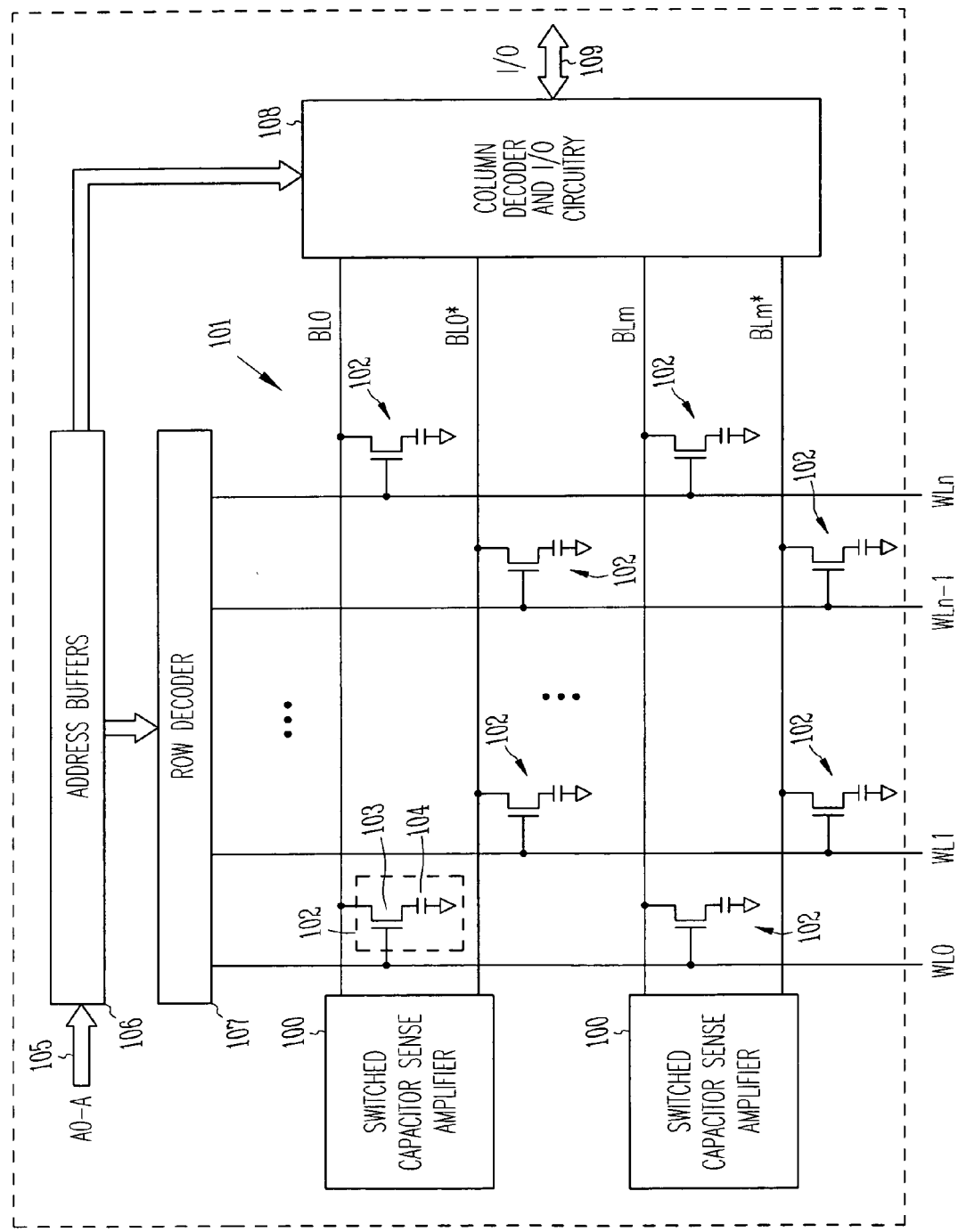
FIG. 1 is a schematic/block diagram illustrating an embodiment of portions of a memory circuit including a switched capacitor sense amplifier.

FIG. 1 is a schematic/block diagram illustrating an embodiment of portions of a memory circuit including switched capacitor sense amplifiers 100. In one embodiment, the memory circuit is a DRAM circuit. The memory circuit includes a memory array 101 including rows and columns of memory cells 102. As illustrated in FIG. 1, memory array 101 has m rows and n columns, with pairs of complementary bit lines BL0/BL0*–BLm/BLm* and word (address) lines WL0–WLn. Each of memory cells 102 is identified by one unique combination of a bit line BL (selected from BL0–BLm) or BL* (selected from BL0*–BLm*) and a word line WL (selected from WL0–WLn).

Complementary bit line pairs BL0/BL0*–BLm/BLm* are used for writing data into and reading data from memory cells 102. Word lines WL0–WLn are address lines used for selecting the memory cells to which data are written into and from which the data are read from. Address buffers 106 receive address signals A0–An from address lines 105 connected to an external controller, such as a microprocessor coupled to the memory circuit. In response, address buffers 106 control row decoders 107 and column decoder and input/output circuitry 108 to access memory cells 102 selected according to address signals A0–An. Data provided at data input/outputs 109 are capable of being written into memory array 101. Data read from memory array 101 are applied to data input/outputs 109. Memory cells 102 each include a switch 103 and a storage capacitor 104. In one embodiment, switch 103 includes an n-channel field effect transistor, such as an NMOS transistor. The n-channel transistor has a drain terminal coupled to a BL (selected from BL0–BLm) or a BL* (selected from BL0*–BLm*), a source terminal coupled to storage capacitor 104, and a gate terminal coupled to a WL (selected from WL0–WLn).

To write or read data, address buffers 106 receive an address identifying a column of memory cells and select one of the word lines WL0–WLn according to the address. Row decoder 107 activates the selected word line to activate switch 103 of each cell connected to the selected word line. Column decoder and input/output circuitry 108 selects the particular memory cell for each data bit according to the address. To write data, each date bit at data input/outputs 109 causes storage capacitor 104 of one of the selected cells to be charged, or to stay discharged, to represent the data bit. To read data, a data bit stored in each of the selected cells, as represented by the charge state of storage capacitor 104 of the selected cell, is transferred to data input/outputs 109.

Switched capacitor sense amplifiers 100 are each coupled between a complementary bit line pair, BL and BL*. Storage capacitor 104 in each of memory cells 102 has a small capacitance and holds a data bit for a limited time as the capacitor discharges. Switched capacitor sense amplifiers 100 are used to "refresh" memory cells 102 by detecting and amplifying signals each representing a stored data bit. The amplified signals recharge the storage capacitors and hence maintain the data in memory cells 102. As discussed in detail below, switched capacitor sense amplifiers 100 each include a cross-coupled pair of inverters with a switched capacitor circuit providing for immunity to transistor characteristic mismatches and offsets.

Figure 2:
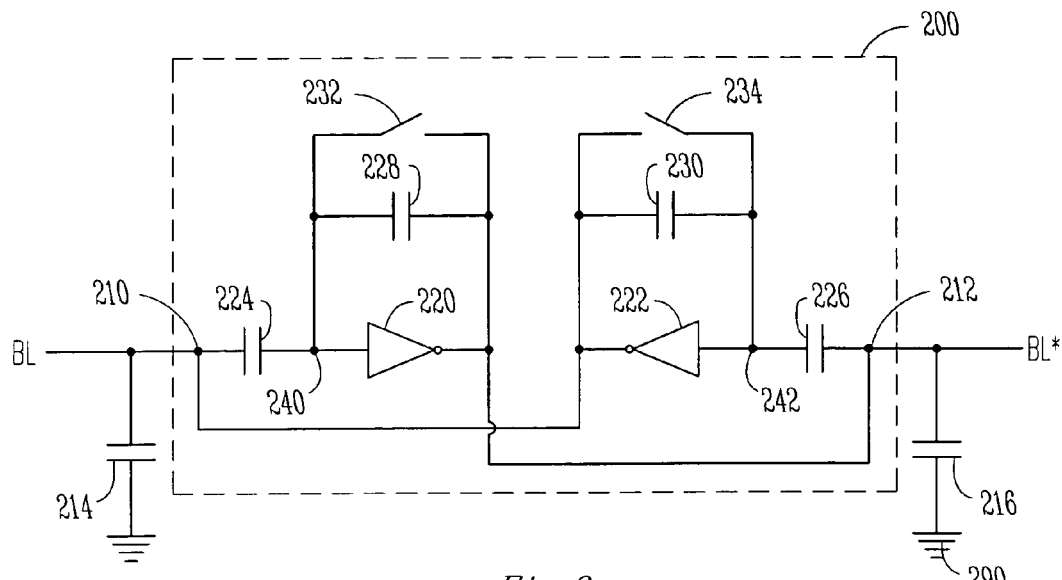
FIG. 2 is a schematic illustrating an embodiment of the switched capacitor sense amplifier.

FIG. 2 is a schematic illustrating an embodiment of a switched capacitor sense amplifier 200. Sense amplifier 200 is coupled between a complementary pair of bit lines BL and BL*. In one embodiment, sense amplifier 200 is used as one of switched capacitor sense amplifiers 100 illustrated in FIG. 1. The pair of bit lines BL and BL* represents any pair of complementary bit lines BL0/BL0*–BLm/BLm* as illustrated in FIG. 1. However, the application of sense amplifier 200 is not limited to the circuit illustrated in FIG. 1.

Sense amplifier 200 includes a bit line node 210 coupled to BL and a bit line node 212 coupled to BL*. A capacitor 214, coupled between BL and a ground node 290, represents the bit line capacitance associated with BL. Another capacitor 216, coupled between BL* and ground node 290, represents the bit line capacitance associated BL*. The bit line capacitance, i.e., the capacitance of each of capacitors 214 and 216, is typically around 1 picofarad.

Sense amplifier 200 detects signals representing bits on bit lines BL and BL* and amplifies the voltage across bit lines BL and BL* (i.e., the difference between the amplitude of the signal at bit line node 210 and the amplitude of the signal at bit line node 212). A cross-coupled pair of inverters 220 and 222 performs the detection and amplification. Inverter 220 has its input capacitively coupled to bit line node 210 and its output directly coupled to bit line node 212. Inverter 222 has its input capacitively coupled to bit line node 212 and its output directly coupled to bit line node 210. An input capacitor 224 is coupled between bit line node 210 and an input node 240, which is coupled to the input of inverter 220. Input capacitor 224 provides the capacitive coupling between bit line node 210 and the input of inverter 220. Another input capacitor 226 is coupled between bit line node 212 and an input node 242, which is coupled to the input of inverter 222. Input capacitor 226 provides the capacitive coupling between bit line node 212 and the input of inverter 222. In one embodiment, input capacitors 224 and 226 each have a capacitance in a range of approximately 0.1 to 1.0 picofarads. A switched capacitor feedback-reset circuit, which includes a reset switch and a capacitor connected in parallel, is coupled between the input and the output of each of inverters 220 and 222. A feedback capacitor 228 is coupled between bit line node 212 and input node 240, i.e., the output and the input of inverter 220, to provide for a capacitively coupled feedback path for inverter 220. A reset switch 232 is coupled between bit line node 212 and input node 240, i.e., the output and the input of inverter 220, to allow for reset of inverter 220 by equalizing the potentials at its input and output. Another feedback capacitor 230 is coupled between bit line node 210 and input node 242, i.e., the output and the input of inverter 222, to provide for a capacitively coupled feedback path for inverter 222. Another reset switch 234 is coupled between bit line node 210 and input node 242, i.e., the output and the input of inverter 222, to allow for reset of inverter 222 by equalizing the potentials at its input and output. In one embodiment, feedback capacitors 228 and 230 each have a capacitance in a range of approximately 0.01 to 0.1 picofarads. The switched capacitor feedback-reset circuits allow inverters 220 and 222 to be separately and independently reset.

When switches 232 and 234 are closed to reset inverters 220 and 222 and precharge bit lines BL and BL* and the inputs of inverters 220 and 222, voltages developed across input capacitors 224 and 226 compensate for the effects of mismatches in transistor characteristics and offsets that would otherwise be seen on bit lines BL and BL*. In other words, the offset voltages developed as the effects of the mismatches in transistor characteristics are absorbed by input capacitors 224 and 226 instead of being applied onto bit lines BL and BL*. When switches 232 and 234 are opened after the reset, a signal is applied to bit lines nodes 210 and 212 and is capacitively coupled to the input of each of inverters 220 and 222. This causes the input voltage of one of inverters 220 and 222 to be driven above its equilibrium value and the input voltage of the other inverter to be driven below its equilibrium value. Mismatches in the equilibrium voltage between inverters 220 and 222 do not substantially affect the output and the operation of sense amplifier 200.

When compared to the known cross-coupled sense amplifier that includes inverters with their inputs and outputs directly coupled to the bit lines, sense amplifier 200 has a better sensitivity for detecting signals on bit lines BL and BL*. If the effects of transistor mismatches and offsets are seen as a voltage across bit lines BL and BL*, they may be detected and amplified as a signal representing a bit and thus cause a data error. By using input capacitors 224 and 226 to absorb the effects of transistor mismatches and offsets, sense amplifier 200 is able to detect signals with smaller amplitudes, knowing they are not effects of the mismatches and offsets.

Figure 3:
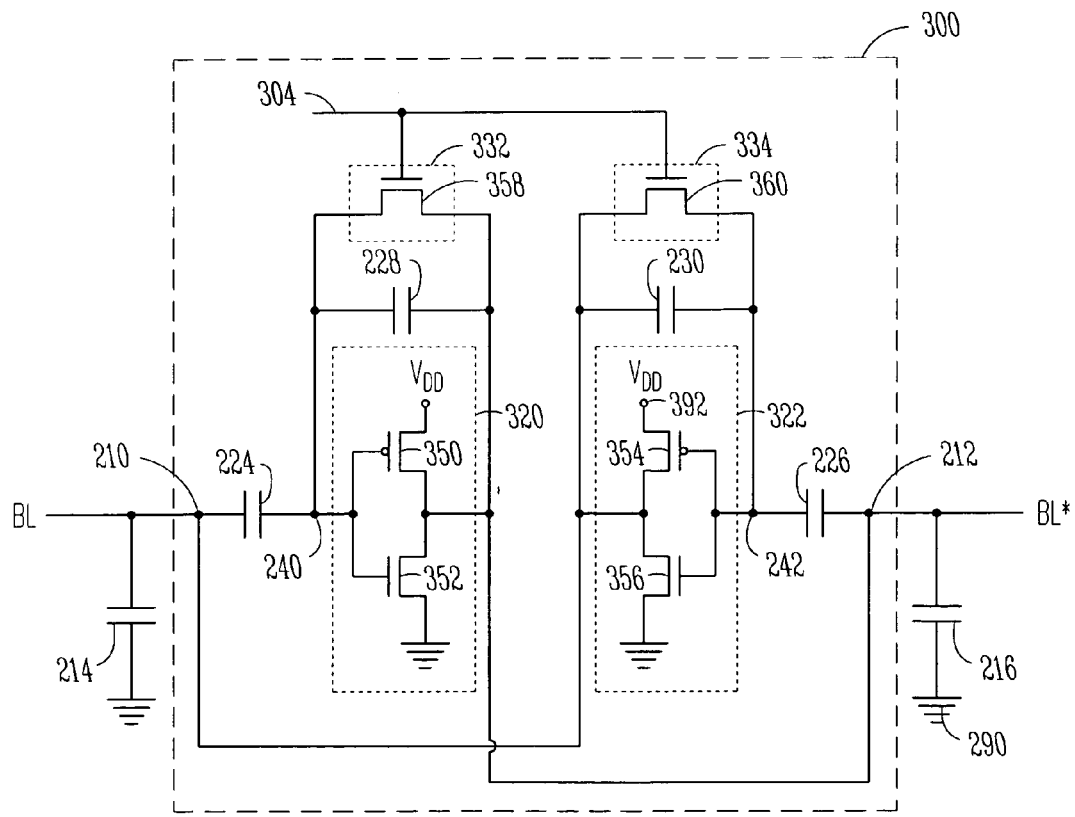
FIG. 3 is a schematic illustrating a specific embodiment of the switched capacitor sense amplifier.

FIG. 3 is a schematic illustrating a switched capacitor sense amplifier 300 as a specific embodiment of sense amplifier 200. Sense amplifier 300 has the basic configuration of sense amplifier 200, with the inverters and reset switches implemented with CMOS technology.

An inverter 320, which is a specific embodiment of inverter 220, includes a complementary pair of a PMOS transistor 350 and an NMOS transistor 352. The gate terminals of transistors 350 and 352 are coupled together as the input of inverter 320, which is then coupled to input node 240. The drain terminals of transistors 350 and 352 are coupled together as the output of inverter 320, which is then coupled to bit line node 212. The source terminal of transistor 350 is coupled to a power supply node 392 (VDD). The source terminal of transistor 352 is coupled to ground node 290.

Another inverter 322, which is a specific embodiment of inverter 222, includes a complementary pair of a PMOS transistor 354 and an NMOS transistor 356. The gate terminals of transistors 354 and 356 are coupled together as the input of inverter 322, which is then coupled to input node 242. The drain terminals of transistors 354 and 356 are coupled together as the output of inverter 322, which is then coupled to bit line node 210. The source terminal of transistor 354 is coupled to power supply node 392 (VDD). The source terminal of transistor 356 is coupled to ground node 290.

A reset switch 332, which is a specific embodiment of reset switch 232, includes an NMOS transistor 358. Transistor 358 has its drain terminal coupled to the output of inverter 320 (bit line node 212) and its source terminal coupled to the input of inverter 320 (input node 240). A reset control line 304 is coupled to the gate terminal of transistor 358.

Another reset switch 334, which is a specific embodiment of reset switch 234, includes an NMOS transistor 360. Transistor 360 has its drain terminal coupled to the output of inverter 322 (bit line node 210) and its source terminal coupled to the input of inverter 322 (input node 242). Reset control line 304 is coupled to the gate terminal of transistor 360.

Figure 4:
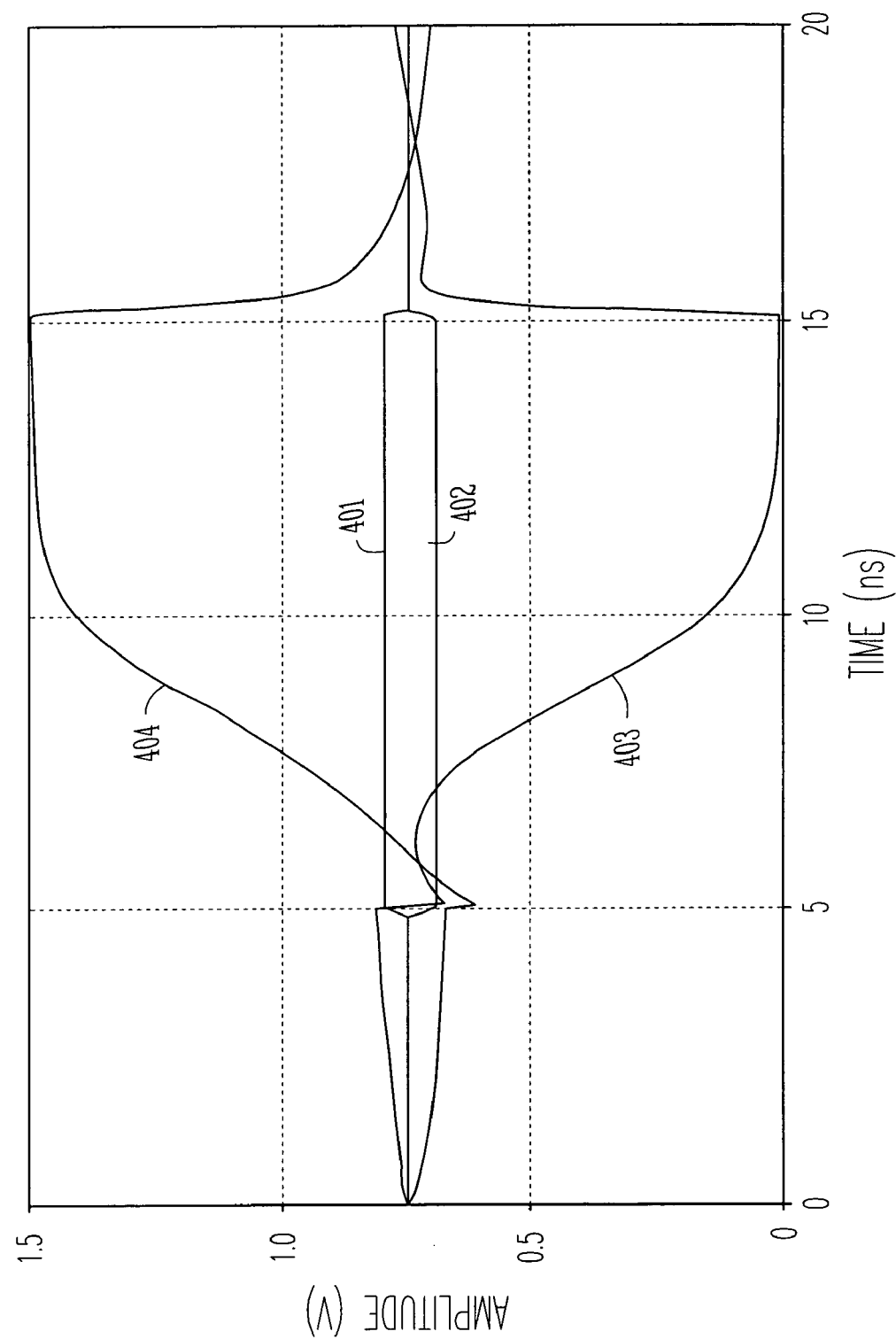
FIG. 4 is a graph showing simulation results illustrating the performance of the switched capacitor sense amplifier of FIG. 3.

FIG. 4 is a graph showing simulation results illustrating the performance of switched capacitor sense amplifier 300. As one specific embodiment, as well as for the purposes of analysis and simulation, each circuit element of sense amplifier 300 is assigned one or more characteristic parameters. These parameters are given by way of example, but not by way of limitation.

A reset pulse is applied to reset control line 304 to reset inverters 320 and 322 simultaneously (while separately and independently). Voltage sources are introduced between capacitor 214 and ground node 290, and between capacitor 216 and ground node 290, to introduce signals to bit lines nodes 210 and 212. A signal 401, representing a data bit, is applied to bit line node 210, and a complementary signal 402 is applied to bit line node 212. As seen in FIG. 4, the signal amplitude is 100 millivolts across bit lines nodes 210 and 212. Capacitors 214 and 216 each have a capacitance (i.e., the bit line capacitance) of 1 picofarad. For the purpose of simulation, 1-ohm resistors each representing a bit line resistance are introduced between bit line node 210 and the output of inverter 322 and between bit line node 212 and the output of inverter 320. Also for the purpose of simulation, 10-megaohm resistors are coupled between the input and output of each of inverters 320 and 322, between the input of each of inverters 320 and 322 and ground node 290, and between each of bit lines 210 and 212 and ground node 290. Input capacitors 224 and 226 each have a capacitance of 1 picofarad. Feedback capacitors 228 and 230 each have a capacitance of 0.01 picofarads. To introduce transistor mismatches, transistors 352 and 356 are given substantially different threshold voltages. For the purpose of simulation and analysis with a specific example, transistor 352 has a threshold voltage that is substantially higher than that of transistor 356. Other characteristic parameters of transistors 352 and 356 are matched. Transistors 350 and 354 are matched transistors. A 1.5-volt voltage is applied to power supply node 392 (VDD).

Transistor 356 has a substantially lower threshold voltage and is therefore substantially more conductive than transistor 352. After the reset, the voltage at the output of inverter 322 (bit line node 210) is lower than the voltage at the output of inverter 320 (bit line node 212). Bit line node 210 is precharged to a voltage lower than VDD/2 and lower than the voltage at the input of inverter 320 (node 240, which equals the voltage at the output of inverter 320 and is higher than VDD/2). The voltage difference between bit line node 210 and input node 240 (the potential-equalized input and output of inverter 320) is applied across input capacitor 224. The voltage at the output of inverter 320 (bit line node 212) is higher than the voltage at the output of inverter 322 (bit line node 210). Bit line node 212 is precharged to a voltage higher than VDD/2 and higher than the voltage at the input of inverter 322 (node 242, which equals the voltage at the output of inverter 322 and is lower than VDD/2). The voltage difference between bit line node 212 and input node 242 (the potential-equalized input and output of inverter 322) is applied across input capacitor 226.

Curves 403 and 404 show simulation results with a 400-millivolt mismatch in threshold voltage between transistors 352 and 356. Curve 403 is the voltage at the output of inverter 320 (bit line node 212), and curve 404 is the voltage at the output of inverter 322 (bit line node 210). Curves 403 and 404 show that sense amplifier 300 correctly detects and amplifies a 100-millivolt signal even though transistors 352 and 356 are mismatched by a 400-millivolt threshold voltage. Curves 403 and 404 also show that the output voltage swing across bit lines 210 and 212 reaches 50% of the rail-to-rail voltage at about 3 nanoseconds.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A memory circuit, comprising:
    a complementary pair of first and second bit lines; and
    a sense amplifier coupled between the first and second bit lines, the sense amplifier including:
        a first inverter including an input capacitively coupled to the first bit line and an output connected to the second bit line;
        a second inverter including an input capacitively coupled to the second bit line and an output connected to the first bit line;
        a first reset circuit, coupled to the first inverter, to selectively equalize potentials at the input and the output of the first inverter; and
        a second reset circuit, coupled to the second inverter, to selectively equalize potentials at the input and the output of the second inverter.

2. The memory circuit of claim 1, wherein the sense amplifier comprises:
    a first input capacitor coupled between the first bit line and the input of the first inverter; and
    a second input capacitor coupled between the second bit line and the input of the second inverter,
    wherein the first and second input capacitor each have a capacitance in a range of approximately 0.1 to 1.0 picofarads.

3. The memory circuit of claim 2, wherein the sense amplifier comprises:
    a first feedback capacitor coupled between the input and the output of the first inverter; and
    a second feedback capacitor coupled between the input and the output of the second inverter.

4. The memory circuit of claim 3, wherein the first and second feedback capacitor each have a capacitance in a range of approximately 0.01 to 0.1 picofarads.

5. The memory circuit of claim 3, wherein the first and second inverters are each a CMOS inverter.

6. The memory circuit of claim 5, wherein the first and second reset switch each comprises a MOS transistor.

7. A memory circuit, comprising:
    a first bit line;
    a second bit line; and
    a sense amplifier including:
        a first inverter having a first input capacitively coupled to the first bit line and a first output coupled to the second bit line;
        a second inverter having a second input capacitively coupled to the second bit line and a second output coupled to the first bit line;
        a first feedback capacitor and a first reset switch each coupled between the first input and the first output; and
        a second feedback capacitor and a second reset switch each coupled between the second input and the second output.

8. The memory circuit of claim 7, wherein the first feedback capacitor and the second feedback capacitor each have a capacitance approximately in a range of 0.01 to 0.1 picofarads.

9. The memory circuit of claim 8, wherein the first reset switch and the second reset switch each comprises a MOSFET switch.

10. The memory circuit of claim 7, wherein the sense amplifier comprises a first input capacitor and a second input capacitor, the first input capacitor coupled between the first bit line and the first input, the second input capacitor coupled between the second bit line and the second input.

11. The memory circuit of claim 10, wherein the first input capacitor and the second input capacitor each have a capacitance approximately in a range of 0.1 to 1.0 picofarads.

12. The memory circuit of claim 7, wherein the sense amplifier comprises a CMOS sense amplifier.

13. A sense amplifier coupled between first and second bit lines in a memory circuit, the sense amplifier comprising:
    a first node to connect to the first bit line;
    a second node to connect to the second bit line;
    a first inverter having a first input and a first output, the first output coupled to the second node;
    a second inverter having a second input and a second output, the second output coupled to the first node;
    a first input capacitor coupled between the first node and the first input;
    a second input capacitor coupled between the second node and the second input;

a first feedback capacitor coupled between the first input and the first output;

a second feedback capacitor coupled between the second input and the second output;

a first reset switch coupled between the first input and the first output; and a second reset switch coupled between the second input and the second output.

14. The sense amplifier of claim 13, wherein the first and second inverters are each a CMOS inverter.

15. The sense amplifier of claim 14, wherein the first inverter comprises:

a first PMOS transistor having a gate terminal coupled to the first input, a drain terminal coupled to the first output, and a source terminal coupled to a power supply node; and a first NMOS transistor having a gate terminal coupled to the first input, a drain terminal coupled to the first output, and a source terminal coupled to a ground node, and wherein the second inverter comprises:

a second PMOS transistor having a gate terminal coupled to the second input, a drain terminal coupled to the second output, and a source terminal coupled to the power supply node; and a second NMOS transistor having a gate terminal coupled to the second input, a drain terminal coupled to the second output, and a source terminal coupled to the ground node.

16. The sense amplifier of claim 15, wherein the first input capacitor and the second input capacitor each have a capacitance approximately in a range of 0.1 to 1.0 picofarads.

17. The sense amplifier of claim 15, wherein the first feedback capacitor and the second feedback capacitor each have a capacitance approximately in a range of 0.01 to 0.1 picofarads.

18. The sense amplifier of claim 15, wherein the first reset switch and the second reset switch each include an NMOS transistor.

19. A method for providing a sense amplifier coupled between complementary first and second bit lines of a memory device, the method comprising:

providing a first inverter having a first input and a first output;

providing a second inverter having a second input and a second output;

providing a first capacitively coupled input path between the first bit line and the first input;

providing a second capacitively coupled input path between the second bit line and the second input;

providing a first capacitively coupled feedback path between the first input and the first output;

providing a second capacitively coupled input path between the second bit line and the second output;

providing a first reset switch between the first input and the first output; and providing a second reset switch between the second bit line and the second output.

20. The method of claim 19, wherein providing the first capacitively coupled input path and providing the second capacitively coupled input path each comprise providing a capacitor having a capacitance in a range of approximately 0.1 to 1.0 picofarads.

21. The method of claim 19, wherein providing the first capacitively coupled feedback path and providing the second capacitively coupled feedback path each comprise providing a capacitor having a capacitance in a range of approximately 0.01 to 0.1 picofarads.

22. The method of claim 19, wherein providing the first reset switch and providing the second reset switch each comprise providing an n-channel transistor.

23. The method of claim 22, wherein providing the first inverter and providing the second inverter each comprise providing a CMOS inverter.

24. A method for making a sense amplifier with a complementary pair of first and second bit lines in a dynamic random access memory (DRAM) circuit, the method comprising:

providing first and second inverters each having an input and an output;

coupling a first input capacitor between the first bit line and the input of the first inverter;

coupling a second input capacitor between the second bit line and the input of the second inverter;

coupling the output of the first inverter to the second bit line;

coupling the output of the second inverter to the first bit line;

coupling a first feedback-reset circuit between the input and the output of the first inverter to allow for selective equalization of potentials at the input and the output of the first inverter; and coupling a second feedback-reset circuit between the input and the output of the second inverter to allow for selective equalization of potentials at the input and the output of the second inverter.

25. The method of claim 24, further including providing the first and second input capacitors each being a capacitor having a capacitance between approximately 0.1 and 1.0 picofarads.

26. The method of claim 24, wherein providing the first and second inverters comprises providing CMOS inverters.

27. The method of claim 24, wherein coupling the first feedback-reset circuit between the input and the output of the first inverter comprises coupling a first feedback capacitor between the input and the output of the first inverter and coupling a first reset switch between the input and the output of the first inverter, and coupling the second feedback-reset circuit between the input and the output of the second inverter comprises coupling a second feedback capacitor between the input and the output of the second inverter and coupling a second reset switch between the input and the output of the second inverter.

28. The method of claim 27, further including providing the first and second feedback capacitors each being a capacitor having a capacitance between approximately 0.01 and 0.1 picofarads.

29. The method of claim 27, wherein further including providing the first and second reset circuit each including a NMOS transistor.

* * * * *

UNITED STATES PATENT AND TRADEMARK OFFICE
CERTIFICATE OF CORRECTION

PATENT NO. : 7,221,605 B2 Page 1 of 1
APPLICATION NO. : 10/931552
DATED : May 22, 2007
INVENTOR(S) : Forbes It is certified that error appears in the above-identified patent and that said Letters Patent is hereby corrected as shown below:

Title Page
On Page 2, in Item (56), under "Other Publications", in column 2, line 1 Dhong reference, delete "High Speed" and insert -- High-Speed --, therefor.

Title Page
On Page 2, in Item (56), under "Other Publications", in column 2, line 23 under U.S. Application. No. 11/493961, delete "Dram" and insert -- DRAM --, therefor.

On sheet 1 of 3, in Fig. 1 (Below Reference Numeral 105), line 1, delete "A0–A" and insert -- A0–An --, therefor.

In column 9, line 37, in Claim 18, delete "NM0S" and insert -- NMOS --, therefor.

Signed and Sealed this

Tenth Day of July, 2007

JON W. DUDAS
*Director of the United States Patent and Trademark Office*